(12) United States Patent
De Oliveira

(10) Patent No.: US 11,575,380 B2
(45) Date of Patent: Feb. 7, 2023

(54) AND GATES AND CLOCK DIVIDERS

(71) Applicant: PRAGMATIC PRINTING LTD., Sedgefield (GB)

(72) Inventor: Joao De Oliveira, Sedgefield (GB)

(73) Assignee: PRAGMATIC PRINTING LTD., Sedgefield (GB)

( * ) Notice: Subject to any disclaimer, the term of this patent is extended or adjusted under 35 U.S.C. 154(b) by 0 days.

(21) Appl. No.: 17/703,795

(22) Filed: Mar. 24, 2022

(65) Prior Publication Data

US 2022/0216871 A1 Jul. 7, 2022

Related U.S. Application Data

(63) Continuation of application No. 17/055,879, filed as application No. PCT/GB2019/051346 on May 16, 2019, now Pat. No. 11,316,518.

(30) Foreign Application Priority Data

May 17, 2018 (GB) .................................... 1808060

(51) Int. Cl.
  *H03K 19/00* (2006.01)
  *G06F 1/06* (2006.01)
  (Continued)

(52) U.S. Cl.
  CPC ........... *H03K 19/0013* (2013.01); *G06F 1/06* (2013.01); *G06F 1/08* (2013.01); *H03K 5/00006* (2013.01); *H04B 5/0037* (2013.01)

(58) Field of Classification Search
  CPC ................................................ H03K 19/0013
  (Continued)

(56) References Cited

U.S. PATENT DOCUMENTS 4,185,209 A 1/1980 Street
4,623,801 A 11/1986 Rocchi
(Continued)

FOREIGN PATENT DOCUMENTS

DE DD 208725 A1 4/1984
DE 3823738 A1 1/1989
(Continued)

OTHER PUBLICATIONS

Invitation to Pay Fees Additional Fees and, Where Applicable, Protest Fee for International Application No. PCT/GB2019/051346, mailed Jul. 24, 2019.
International Search Report for International Application No. PCT/GB2019/051346, dated Sep. 24, 2019.
(Continued)

*Primary Examiner* — Tomi Skibinski
(74) *Attorney, Agent, or Firm* — Jason H. Vick; Sheridan Ross, PC

(57) ABSTRACT

An AND gate comprises: a first input; a second input; an output; and a plurality of field effect transistors, FETs, each having a respective first terminal, a respective second terminal, and a respective gate terminal to which a voltage may be applied to control a conductivity of a respective channel between the respective first terminal and the respective second terminal. The plurality of FETs comprises: a first FET having its first terminal directly connected to the first input, its second terminal directly connected to the output, and its gate terminal directly connected to the second input; a second FET having its first terminal directly connected to the first input, its second terminal directly connected to the output, and its gate terminal directly connected to the output; and a third FET having its first terminal directly connected to the second input, its second terminal directly connected to the output, and its gate terminal directly connected to the output. Also disclosed is a clock divider stage for receiving
(Continued)

a first clock signal oscillating at a first frequency and a second clock signal, the second clock signal being an inversion of the first clock signal, and generating a first output clock signal oscillating at half of the first frequency.

11 Claims, 20 Drawing Sheets

(51) Int. Cl.
    *G06F 1/08*         (2006.01)
    *H03K 5/00*         (2006.01)
    *H04B 5/00*         (2006.01)

(58) Field of Classification Search
    USPC .......................................................... 327/115
    See application file for complete search history.

(56) References Cited

U.S. PATENT DOCUMENTS

| | | |
|---|---|---|
| 5,015,881 A | 5/1991 | Chappell et al. |
| 9,438,233 B1 * | 9/2016 | Marr ................. H03K 19/0806 |
| 2006/0119394 A1 | 6/2006 | Dronavalli |
| 2010/0079179 A1 | 4/2010 | Atsumi |
| 2021/0226629 A1 | 7/2021 | De Oliveira |

FOREIGN PATENT DOCUMENTS

| | | |
|---|---|---|
| EP | 0200266 A1 | 11/1986 |
| EP | 3075027 A1 | 10/2016 |
| JP | S61-218224 A | 9/1986 |
| JP | 2004-228812 A | 8/2004 |

OTHER PUBLICATIONS

Written Opinion for International Application No. PCT/GB2019/051346, dated Sep. 24, 2019.
International Preliminary Report on Patentability for International Application No. PCT/GB2019/051346, dated Nov. 26, 2020.
Search Report for Great Britain Application No. 1808060.6, dated Oct. 24, 2018.
Search Report for Great Britain Application No. 1808060.6, dated Mar. 19, 2019.
Notice of Allowance for U.S. Appl. No. 17/055,879, dated Dec. 29, 2021.

* cited by examiner

AND GATES AND CLOCK DIVIDERS

CROSS-REFERENCE TO RELATED APPLICATIONS

This application is a Continuation of U.S. patent application Ser. No. 17/055,879, filed Nov. 16, 2020, now U.S. Pat. No. 11,316,518, which is a National Stage Application under 35 U.S.C. 371 of PCT Application No. PCT/GB2019/051346 having an international filing date of 16 May 2019, which designated the United States, which PCT application claimed the benefit of Great Britain Application No. 1808060.6, filed 17 May 2018, each of which are incorporated herein by reference in their entirety.

FIELD OF THE INVENTION

Certain aspects of the present invention relate to AND gates, to clock dividers, and to apparatus incorporating such AND gates and/or clock dividers.

BACKGROUND TO THE INVENTION

AND gates are well-known components of a variety of electronic circuits and find a wide range of applications. Although a wide variety of configurations of AND gates (which may also be referred to as AND gate circuits) are known, it is desirable to improve the speed of switching of the outputs of the AND gates in response to changes in their input signals, and it is also desirable to reduce the power consumed by an AND gate in many applications, especially in applications where the power budget for powering the AND gate and the electronic circuit it is incorporated in is low.

Similarly, clock divider circuits incorporating one or more clock divider stages to generate an output signal having a frequency that is a fraction of the frequency of an input signal, are well-known. Again, it is desirable to reduce the power consumed by a clock divider in numerous applications, particularly those where the available power is low.

SUMMARY OF THE INVENTION

Certain aspects of the present invention aim to provide AND gates, clock divider stages, and/or apparatus comprising such AND gates and/or clock divider stages which overcome, at least partly, one or more of the problems associated with the prior art. Certain embodiments aim to provide faster AND gates, AND gates consuming lower power, and clock divider stages consuming lower power than the respective prior art AND gates and divider stages.

According to a first aspect of the present invention there is provided an AND gate (which may also be referred to as an AND gate circuit) comprising: a first input (which may also be referred to as a first input terminal, or first gate input); a second input (or second input terminal, or second gate input); an output (or output terminal, or gate output); and a plurality of field effect transistors, FETs, each having a respective first terminal, a respective second terminal, and a respective gate terminal to which a voltage may be applied to control a conductivity of a respective channel between the respective first terminal and the respective second terminal, wherein said plurality of FETs comprises: a first FET having its first terminal directly connected (coupled) to the first input (terminal), its second terminal directly connected (coupled) to the output (terminal), and its gate terminal directly connected (coupled) to the second input (terminal); a second FET having its first terminal directly connected (coupled) to the first input (terminal), its second terminal directly connected (coupled) to the output (terminal), and its gate terminal directly connected (coupled) to the output (terminal); and a third FET having its first terminal directly connected (coupled) to the second input (terminal), its second terminal directly connected (coupled) to the output (terminal), and its gate terminal directly connected (coupled) to the output (terminal).

"Directed connected" or "directly coupled" in this context means that the specified terminals and/or inputs are connected by conductive means having negligible resistance, in terms of its effect on the operation of the device or circuit as a whole, such as by conductive tracks or wires or other conductive elements, with no resistor or other circuit element in between.

Advantageously, an AND gate in accordance with this first aspect of the invention comprises no load (e.g. no load resistor) and is therefore able to operate faster and with reduced power consumption compared with prior art AND gates based on a unipolar configuration with at least one load.

In certain embodiments, each of said plurality of FETs is an N-channel device.

In certain embodiments, each of said plurality of FETs is a P-channel device.

In certain embodiments, each said first terminal is a drain terminal and each said second terminal is a source terminal.

According to another aspect of the present invention there is provided an AND gate (circuit) comprising: a first input (terminal); a second input (terminal); an output (terminal); a field effect transistor, FET, having a first terminal, a second terminal, and a gate terminal to which a voltage may be applied to control a conductivity of a channel between the first terminal and the second terminal; and first and second diodes, each having a respective first terminal and a respective second terminal, and having a forward conduction direction from the respective second terminal to the respective first terminal, wherein said FET has its first terminal directly connected (coupled) to the first input (terminal), its second terminal directly connected (coupled) to the output (terminal), and its gate terminal directly connected (coupled) to the second input (terminal), said first diode having its first terminal directly connected (coupled) to the first input (terminal), and its second terminal directly connected (coupled) to the output (terminal), and said second diode having its first terminal directly connected (coupled) to the second input (terminal), and its second terminal directly connected (coupled) to the output (terminal).

Again, an AND gate in accordance with this aspect of the invention provides the advantage of being faster and operating with reduced power consumption compared with prior art AND gates based on a unipolar architecture with load.

In certain embodiments, said FET is an N-channel device.

In certain embodiments, said FET is a P-channel device.

In certain embodiments, said first terminal of the FET is a drain terminal and said second terminal of the FET is a source terminal.

In certain embodiments, at least one of said first and second diodes comprises a respective diode-connected transistor. Thus, in certain embodiments, both of the first and second diodes are implemented by diode-connected transistors, having their respective gate terminals connected to a respective one of their first and second terminals. In certain other embodiments, at least one of said first and second diodes comprises a respective Schottky diode or other fast-switching low forward drop rectifier.

According to another aspect of the present invention there is provided a clock divider stage for receiving a first clock signal oscillating at a first frequency and a second clock signal, said second clock signal being an inversion (or substantially an inversion) of said first clock signal, and generating a first output clock signal oscillating at half of said first frequency, the clock divider stage comprising: a first input terminal for receiving said first clock signal; a second input terminal for receiving said second clock signal; a first output terminal at which, in use, said first output clock signal is generated; a first circuit portion comprising: first, second, and third AND gates, each having a respective first input, a respective second input, and a respective output; a first NOR gate having three inputs, each connected to a respective one of the outputs of the first, second, and third AND gates, and an output; and a first NOT gate (or first inverter) having an input, connected to the output of the first NOR gate, and an output; a second circuit portion comprising: fourth, fifth, and sixth AND gates, each having a respective first input, a respective second input, and a respective output; a second NOR gate having three inputs, each connected to a respective one of the outputs of the fourth, fifth, and sixth AND gates, and an output; and a second NOT gate (or second inverter) having an input, connected to the output of the second NOR gate, and an output; wherein: the first input of the first AND gate is connected to the first input of the second AND gate and to the output of the second NOR gate, and the second input of the first AND gate is connected to the first input terminal; the first input of the second AND gate is connected to the first input of the first AND gate and to the output of the second NOR gate, and the second input of the second AND gate is connected to the second inputs of the third, fifth, and sixth AND gates and to the output of the first NOT gate; the first input of the third AND gate is connected to the second input terminal, and the second input of the third AND gate is connected to the second inputs of the second, fifth, and sixth AND gates and to the output of the first NOT gate; the first input of the fourth AND gate is connected to the first input of the fifth AND gate and to the output of the second NOT gate, and the second input of the fourth AND gate is connected to the first input terminal; the first input of the fifth AND gate is connected to the first input of the fourth AND gate and to the output of the second NOT gate, and the second input of the fifth AND gate is connected to the second inputs of the second, third, and sixth AND gates and to the output of the first NOT gate; the first input of the sixth AND gate is connected to the second input terminal, and the second input of the sixth AND gate is connected to the second inputs of the second, third, and fifth AND gates and to the output of the first NOT gate; and the first output terminal is connected to the output of the second NOT gate. It will be appreciated that in alternative embodiments, the combination of the first NOR gate and first NOT gate may be replaced by a first OR gate having three inputs and an output, and/or the combination of the second NOR gate and second NOT gate may be replaced by a second OR gate having three inputs and an output In certain embodiments of this aspect of the present invention, each of the first to sixth AND gates comprises a respective AND gate in accordance with any one of the above-mentioned aspects of the invention. Such embodiments are therefore able to generate a divided output clock signal without consuming as much power as prior art clock divider stages incorporating AND gates based on a unipolar architecture with loads. In other words these embodiments of the present invention decrease the power consumed by reducing the number of loads in the clock divider circuitry.

In certain embodiments, the clock divider stage further comprises a second output terminal at which, in use, a second output clock signal is generated, said second output clock signal being an inverse (or at least substantially an inverse) of the first output clock signal, wherein said second output terminal is connected to the output of the second NOR gate and the input of the second NOT gate.

In certain embodiments, each of said NOR and NOT gates comprises a respective load (e.g. one or more respective load resistors).

Thus, although each of the NOR and NOT gates may comprise at least one respective load, each of the six AND gates may comprise no load, thereby reducing the power consumption of the circuit in generating the divided output signal from the input clock signal(s).

Another aspect of the present invention provides apparatus comprising: at least a first clock divider stage in accordance with any one of claims 9 to 12; and a clock signal generator stage arranged to generate said first and second clock signals and provide said first and second clock signals to the first and second input terminals respectively of said first clock divider stage.

In certain embodiments, the clock signal generator stage is adapted to receive a signal comprising a component oscillating at said first frequency, and generate said first and second clock signals from the received signal.

In such embodiments, the clock signal generator stage may therefore be described as a clock extractor or clock signal extractor, as it extracts the clock signal from the received signal.

In certain embodiments, the clock signal generator stage comprises an antenna arranged to receive said signal comprising a component oscillating at said first frequency.

In certain embodiments, the antenna comprises a first antenna terminal and a second antenna terminal between which a voltage signal is generated when the antenna receives said signal.

In such embodiments, the received signal may be used to power the apparatus. Therefore, the available power budget for extracting the clock signal and producing a divided clock output signal (using one or more clock divider stages, and for example for synchronisation purposes) may be very low. Therefore, certain embodiments utilise clock divider stages incorporating AND gates in accordance with one of the above-mentioned aspects of the invention, to greatly reduce the power consumed by the clock division circuitry. Advantageously, this can enable a substantially divided clock output signal to be produced from only a very small power budget, for example the power received by a near field communication (NFC) antenna in an NFC tag.

In certain embodiments, the clock signal generator stage comprises a plurality of field effect transistors, FETs, each having a respective first terminal, a respective second terminal, and a respective gate terminal to which a voltage may be applied to control a conductivity of a respective channel between the respective first terminal and the respective second terminal, wherein said plurality of FETs of the clock signal generator stage comprises: a first FET having its first terminal directly connected (coupled) to the first input terminal of the first clock divider stage, and its second and gate terminals directly connected (coupled) to the first antenna terminal; a second FET having its first terminal directly connected (coupled) to the second input terminal of the first clock divider stage, and its second and gate terminals directly connected (coupled) to the second antenna terminal; a third FET having its first terminal directly connected (coupled) to the first antenna terminal, and its second and gate terminals terminal directly connected (coupled) to a first voltage rail; a fourth FET having its first terminal directly connected (coupled) to the second antenna terminal, and its second and gate terminals terminal directly connected (coupled) to the first voltage rail; a first resistor having a first terminal connected to the first input terminal of the first clock divider stage, and a second terminal connected to the first voltage rail; and a second resistor having a first terminal connected to the second input terminal of the first clock divider stage, and a second terminal connected to the first voltage rail. Although such embodiments comprise a plurality of FETs, it will be appreciated that each FET is in a diode-connected configuration, with its gate connected to one of its source and drain terminals. Thus, in alternative embodiments, one or more (and, in certain embodiments, all) of the FETs may be replaced by respective diodes, including Schottky or other low forward drop diodes. In such "diode implementations" the first resistor is still needed; it polarises the diodes, guaranteeing signal integrity.

Thus, the clock signal generator stage in accordance with these embodiments of the invention may be able to generate both the clock signal and the inverse clock signal from a low power signal received by an antenna.

In certain embodiments, the apparatus comprises a plurality of clock divider stages arranged in series with each other (i.e. in a cascade arrangement), each clock divider stage being in accordance with any one of claims 9 to 12, the plurality of clock divider stages comprising said first clock divider stage, arranged to receive said first and second clock signals, and at least one subsequent clock divider stage, each subsequent clock divider stage being arranged to receive, at its first and second input terminals respectively, the first and second output clock signals from the preceding clock divider stage.

It will be appreciated that the number of clock divider stages may be selected to generate the output clock signal of the desired frequency. In certain embodiments, where each of the clock divider stages comprises the fast, low power AND gates described above, the overall power consumption of the apparatus, even with a plurality of clock divider stages arranged in series, may be sufficiently low to enable generation of the desired output frequency from even a low power signal received wirelessly by an antenna, such as an NFC antenna, for example.

In certain embodiments, said plurality of clock divider stages comprises seven clock divider stages.

Another aspect of the invention provides an NFC tag comprising apparatus in accordance with the claims as appended hererto.

BRIEF DESCRIPTION OF THE DRAWINGS

Aspects and embodiments of the present invention will now be described with reference to the accompanying drawings, of which:

FIG. 13 (b) illustrates another clock signal generator circuit (or clock extractor) in accordance with another aspect of the invention, and suitable for incorporation in other aspects and embodiments of the invention;

FIG. 13 (c) illustrates another clock signal generator circuit (or clock extractor) in accordance with an aspect of the invention, and suitable for incorporation in other aspects and embodiments of the invention;

DETAILED DESCRIPTION OF EMBODIMENTS OF THE INVENTION

Figure 1:
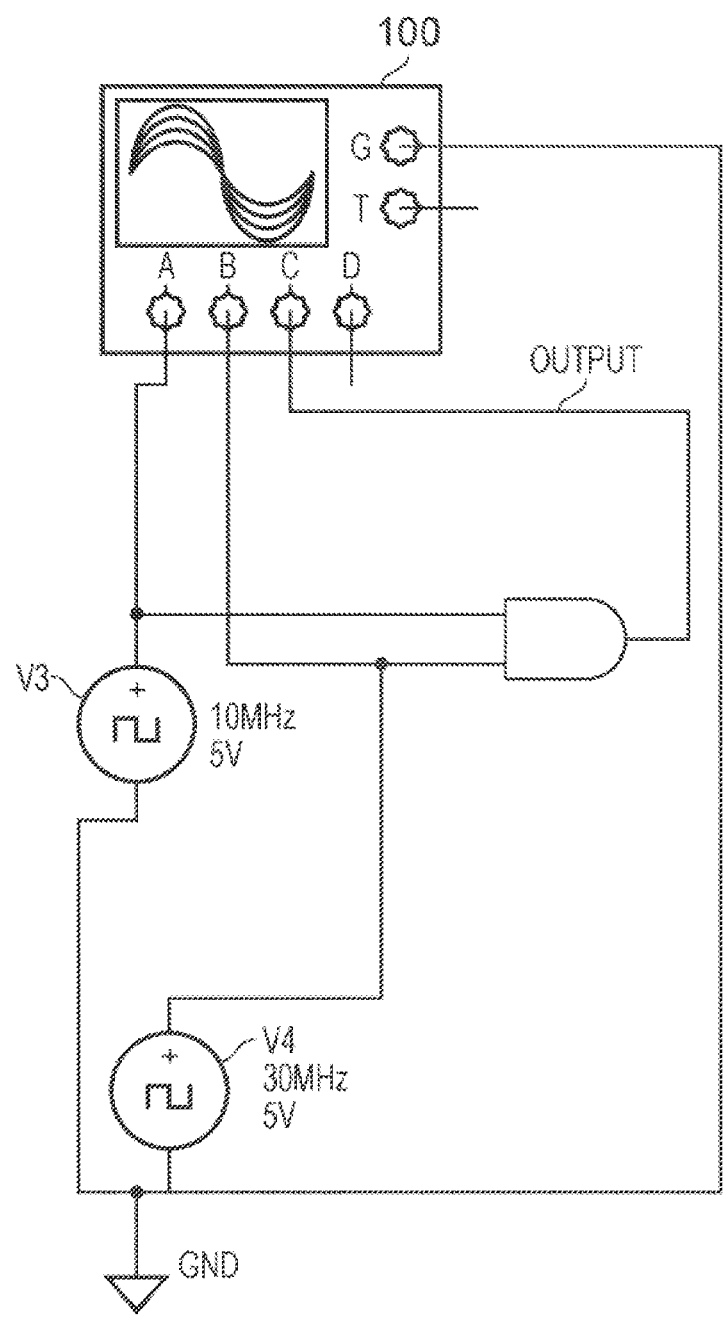
FIG. 1 illustrates a test circuit incorporating an AND gate in accordance with the prior art.
Figure 2:
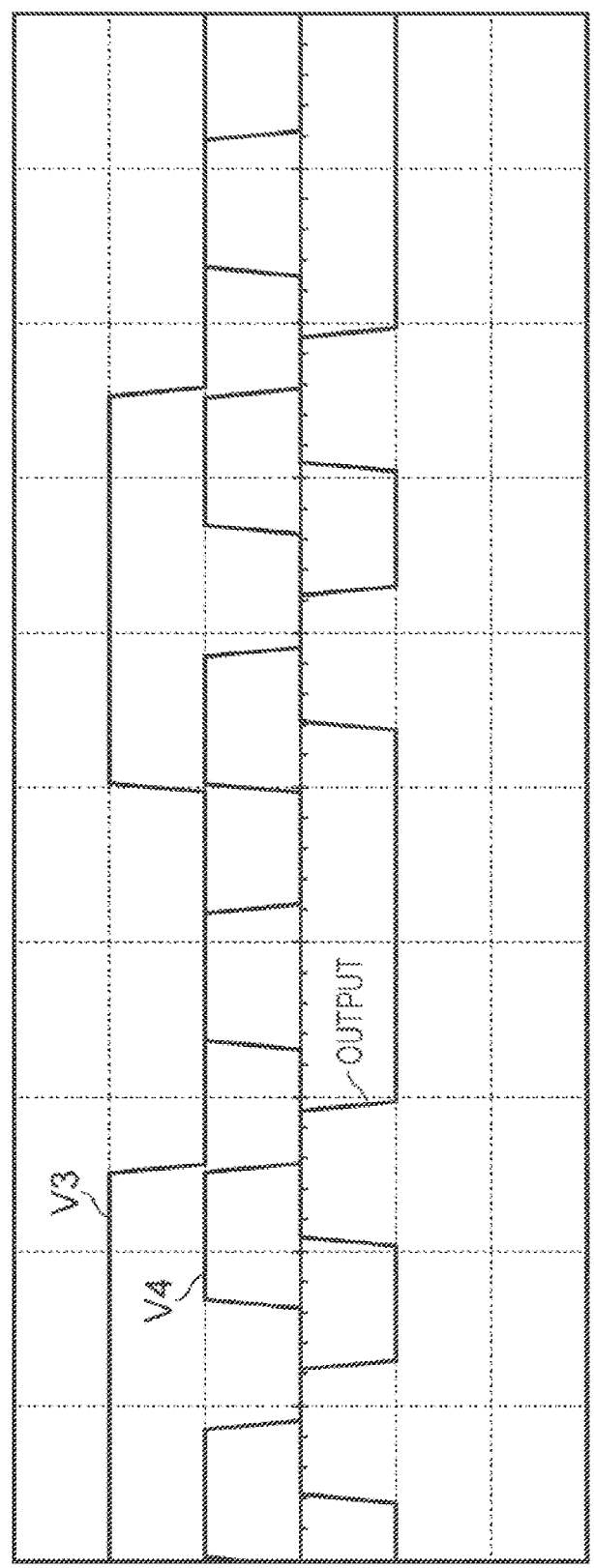
FIG. 2 illustrates voltage wave forms in the test circuit of FIG. 1.

Referring now to FIG. 1, this shows a generic AND gate from a simulator's library. V3 is one of the two AND gate inputs (in this example a 5V square wave at 10 MHz), and V4 is the other input (a 5V square wave at 30 MHz). Component 100 is the simulator's oscilloscope. In operation, the output signal generated by the AND gate is as shown in FIG. 2. This simulation is based on real device characteristics (74F08), and FIG. 2 illustrates that, for these input signal frequencies, there are non- negligible propagation delays, which explain the delay in output response.

Figure 3A:
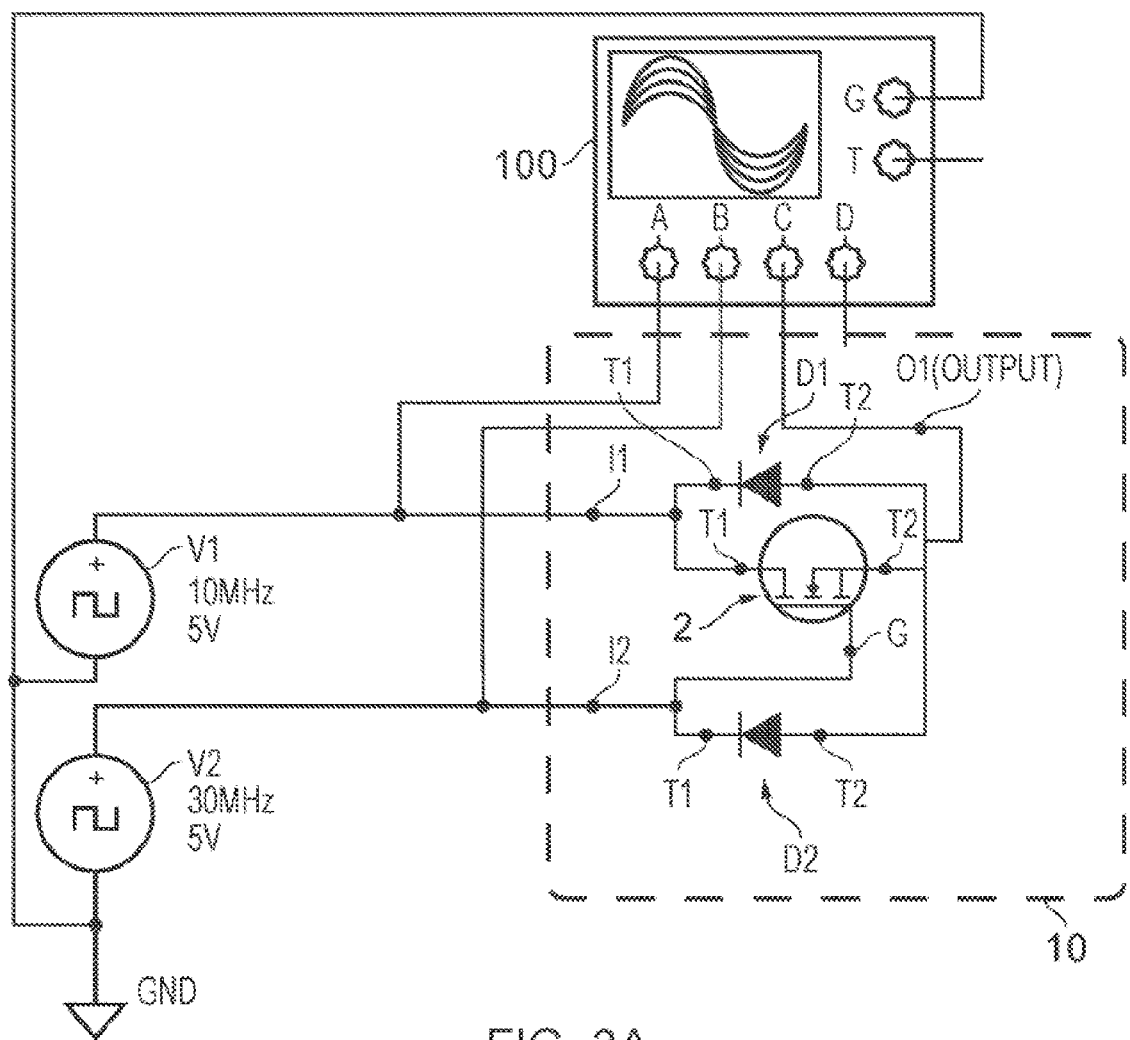
FIG. 3A illustrates a test circuit incorporating an AND gate in accordance with an embodiment of an aspect of the invention.

Referring now to FIG. 3A, this illustrates a simulation circuit incorporating a fast analog AND gate 10 embodying an aspect of the present invention. The AND gate comprises: a first input I1 (which may also be referred to as a first input terminal, or first gate input); a second input I2 (or second input terminal, or second gate input); an output O1 (or output terminal or gate output); a field effect transistor, FET, 2 having a first terminal T1, a second terminal T2, and a gate terminal G to which a voltage may be applied to control a conductivity of a channel between the first terminal and the second terminal; and first and second diodes D1 and D2, each having a respective first terminal T1 and a respective second terminal T2, and having a forward conduction direction from the respective second terminal to the respective first terminal. The FET 2 has its first terminal directly connected (coupled) to the first input (terminal), its second terminal directly connected (coupled) to the output (terminal), and its gate terminal directly connected (coupled) to the second input (terminal). The first diode D1 has its first terminal T1 directly connected (coupled) to the first input (terminal), and its second terminal T2 directly connected (coupled) to the output (terminal). The second diode D2 has its first terminal T1 directly connected (coupled) to the second input (terminal), and its second terminal T2 directly connected (coupled) to the output (terminal).

The principle behind the "Fast Analog AND Gate" of FIG. 3A is as follows. To be as fast as possible any type of logic has to drive both levels HIGH and LOW, hard. A unipolar logic, N type only (or P type only) is inherently slow, because only one level is driven hard (hard in this case means low impedance to the level it is driven to). Thus, an N type inverter with a resistive load, when input (transistor gate) is driven high, sees the output drive hard low, at the maximum speed permitted by the intrinsic transistor's characteristics/geometry. But when the input is driven low, the output is only driven high through the load resistive value. The speed of the rising edge will depend on the resistive load value and the system parasitic capacities. Therefore, there is a trade-off between speed and power consumption, i.e. the faster we need the rising edge, the more current is required.

In contrast, the structure of the "Fast Analog AND Gate" of FIG. 3A has two diodes and a transistor. This allows an AND function between the two inputs V1 and V2 supplied to the input terminals 11 and 12 respectively, with Vout being the output (at output terminal O1). The output is always hard driven, either to high level or low level. Therefore, the maximum speed is limited by the intrinsic diodes and transistor's characteristics/geometry. Because the "Fast Analog AND Gate" of FIG. 3A is using the input signals to create the output signal levels (high and low), instead of using, for example, a resistor connected to VCC and a transistor connected to VDD, the output at O1 would need to be "regenerated"—that is, its amplitude would need to be boosted—if several of these gates were serialised. However, regeneration is not required in certain embodiments of the Low Power Fast Clock divider aspect of the invention described below, as each "Fast Analog AND Gate" is followed by a NOR gate.

Figure 4:
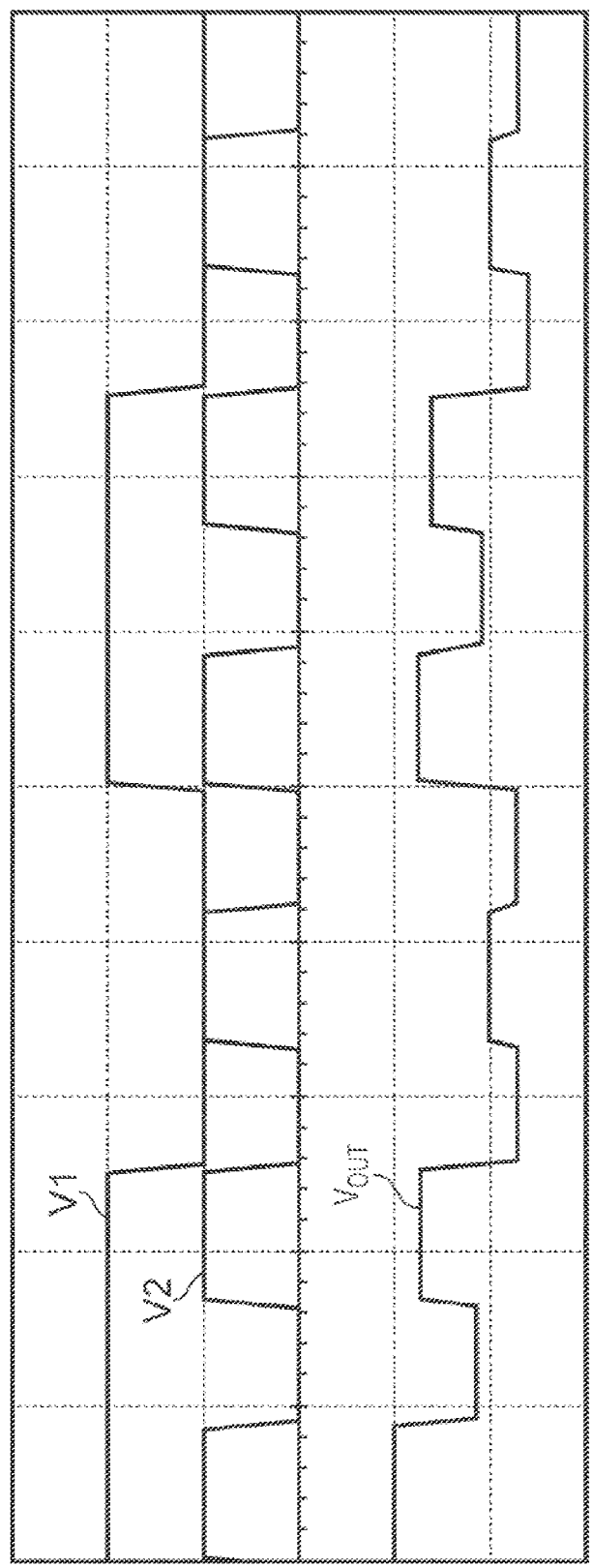
FIG. 4 illustrates voltage wave forms in the test circuit of FIG. 3A.

The simulation results of the above schematic (fIG. 3A, using 2 generic diodes and a generic N type standard transistor) are shown in FIG. 4. The top signal is input V1 (10 MHz/5 V, square wave), centre signal is input V2 (30 MHz/5V square wave), and the bottom signal Vout is output (at O1). As can be seen, as the diodes have relatively large parasitic capacitances, this induces negative voltages on falling edges, and because the diodes/transistor have a non-negligible forward/Vth voltage drop, we can see some low levels not being "fully low" (e.g. close to VDD) or some high levels not being "fully high" (e.g. close to VCC).

To improve performance, therefore, in certain embodiments of the above aspect, and indeed in certain embodiments of another aspect of the invention, the diodes may be replaced with Schottky or other low forward voltage drop diodes, or with transistors, as follows.

Figure 3B:
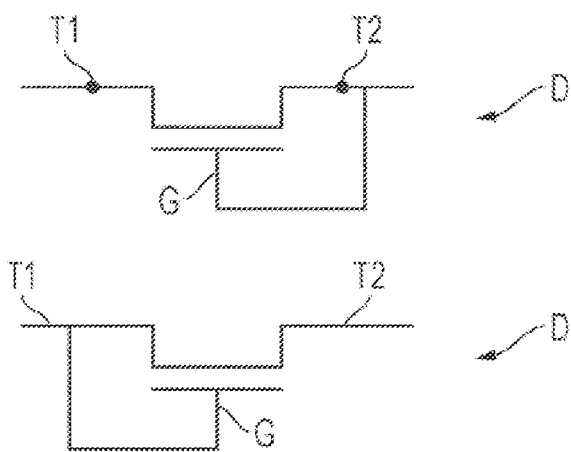
FIG. 3B illustrates two diode-connected transistors which may be used as first and/or second diodes in AND gates embodying, or used in embodiments of, an aspect of the invention.

FIG. 3B shows two diode-connected transistors which may be used as diodes in certain embodiments of the invention. The upper diode-connected transistor has its gate G connected to its second terminal T2, and the lower diode-connected transistor has its gate G connected to its first terminal T1. Thus, in certain embodiments, the AND circuit 10 of FIG. 3A may have D1 and/or D2 implemented by a diode-connected transistor, such as one of those shown in FIG. 3B. Depending on the device technology being used (e.g. NMOS or PMOS), the skilled person will select the appropriately connected diode-connected transistors to provide the correct diode operation for proper functioning of the AND gate.

Figure 5:
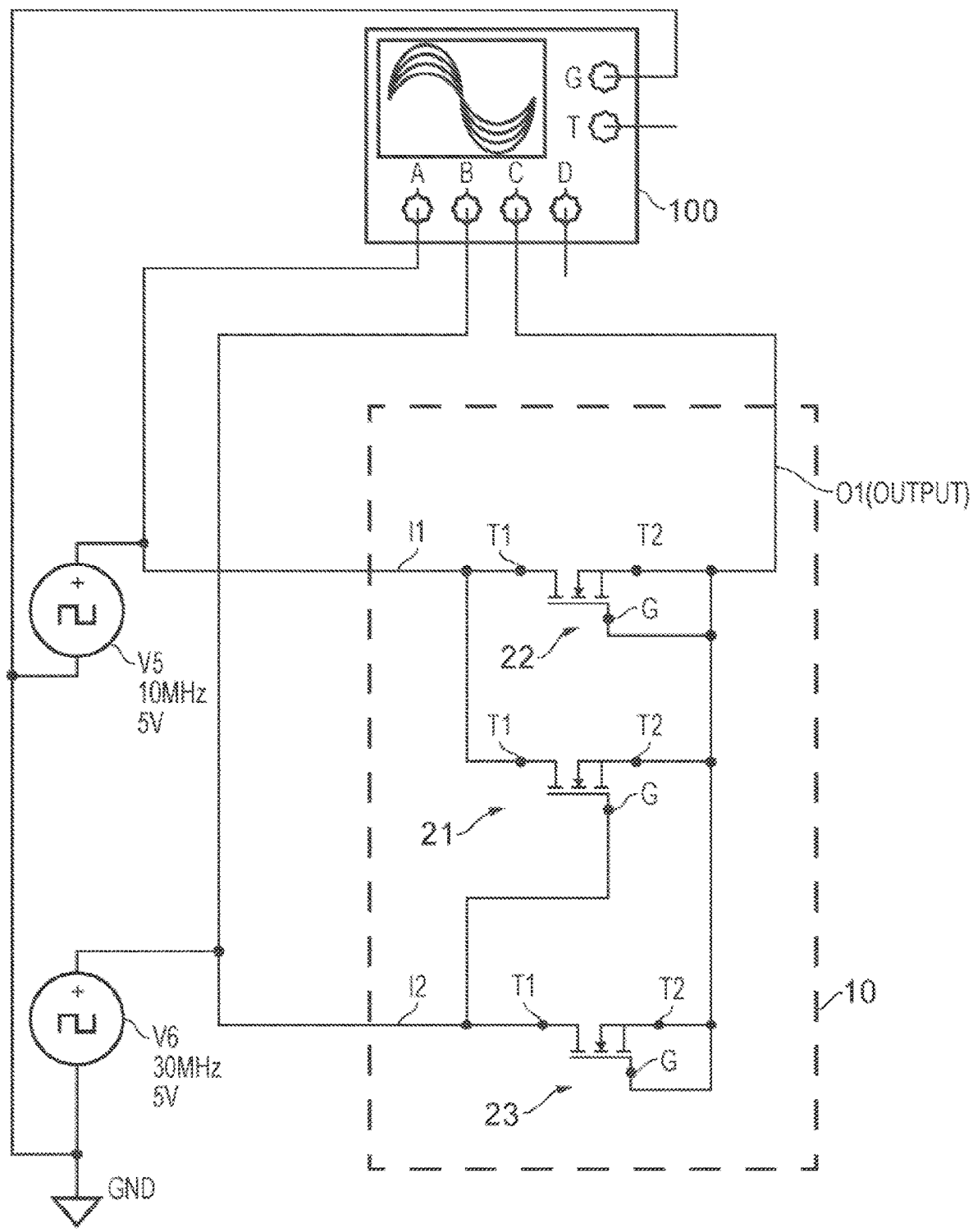
FIG. 5 illustrates a test circuit incorporating an AND gate in accordance with another embodiment of an aspect of the invention.

FIG. 5 shows an embodiment of an aspect of the invention, again a Fast Analog AND Gate, implemented fully with transistors only. The circuit has similar functionality as the circuit in FIG. 3A, but this time uses N type transistors only to create diodes and transistor functions. It will be appreciated that alternative embodiments may use P type transistors.

Thus, FIG. 5 illustrates an AND gate 10 (which may also be referred to as an AND gate circuit) comprising: a first input I1 (which may also be referred to as a first input terminal, or first gate input); a second input I2 (or second input terminal, or second gate input); an output O1 (or output terminal, or gate output); and a plurality of field effect transistors, FETs, each having a respective first terminal T1, a respective second terminal T2, and a respective gate terminal G to which a voltage may be applied to control a conductivity of a respective channel between the respective first terminal and the respective second terminal. The plurality of FETs comprises: a first FET 21 having its first terminal directly connected (coupled) to the first input (terminal), its second terminal directly connected (coupled) to the output (terminal), and its gate terminal directly connected (coupled) to the second input (terminal); a second FET 22 having its first terminal directly connected (coupled) to the first input (terminal), its second terminal directly connected (coupled) to the output (terminal), and its gate terminal directly connected (coupled) to the output (terminal); and a third FET 23 having its first terminal directly connected (coupled) to the second input (terminal), its second terminal directly connected (coupled) to the output (terminal), and its gate terminal directly connected (coupled) to the output (terminal). In FIG. 5, each transistor has relatively small geometry (e.g. L=100 microns, W=100 microns), compared with the larger transistor (2N7000) used in the circuit of FIG. 3A. It will be appreciated that, in the context of this specification, "directly connected", or "directly coupled", means without any intermediate component (particularly without any intermediate resistor), such that the potential at the first input terminal is substantially the same as the potential at the first terminals of the first and second FETs, etc. This direct connection will typically be by means of low-resistance conductive tracks, traces, wires, or other such connecting means.

Figure 6:
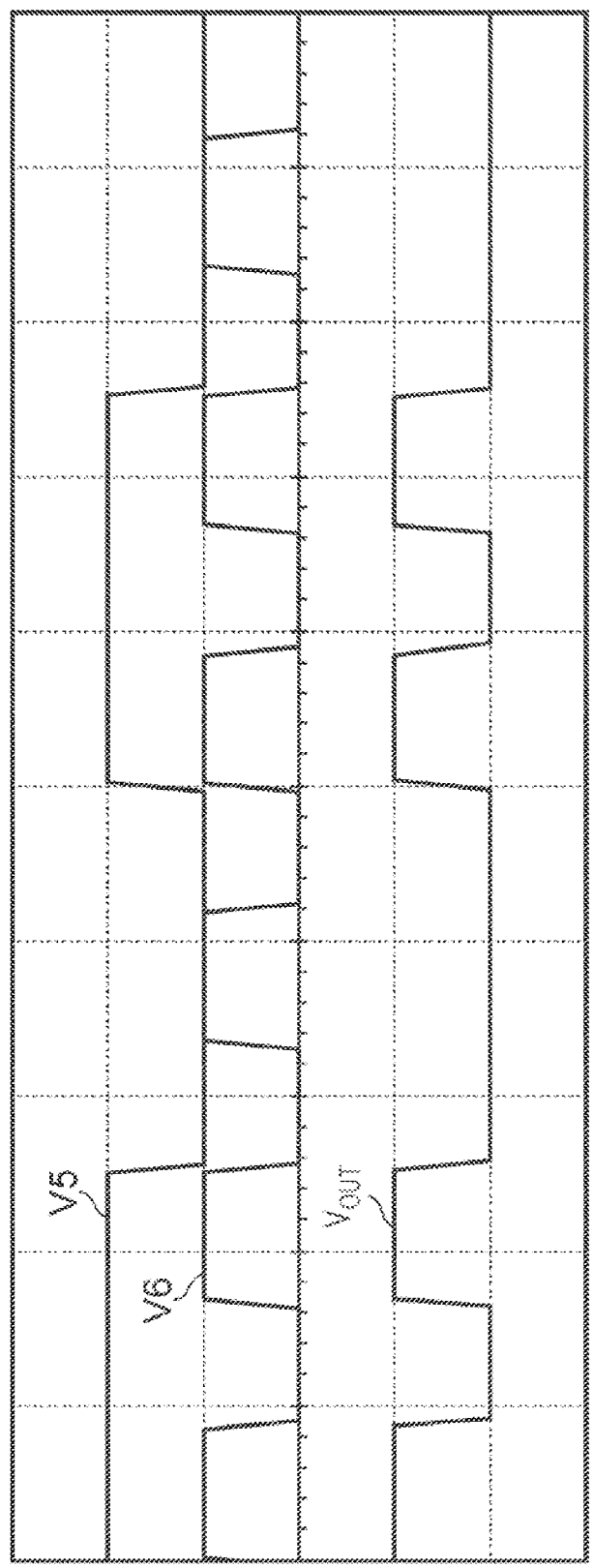
FIG. 6 illustrates voltage wave forms in the test circuit of FIG. 5.

Simulation results for the operation if the gate of FIG. 5 are shown in FIG. 6. Thus, it can be seen that, by using a transistor only solution, as well as using transistors of a relatively small geometry (as opposed to the 2n7000 used in FIG. 3A above), the parasitic effects and the voltage drop effects are greatly reduced. The speed is, also, only limited by the transistors' intrinsic characteristics/geometry.

Figure 7:
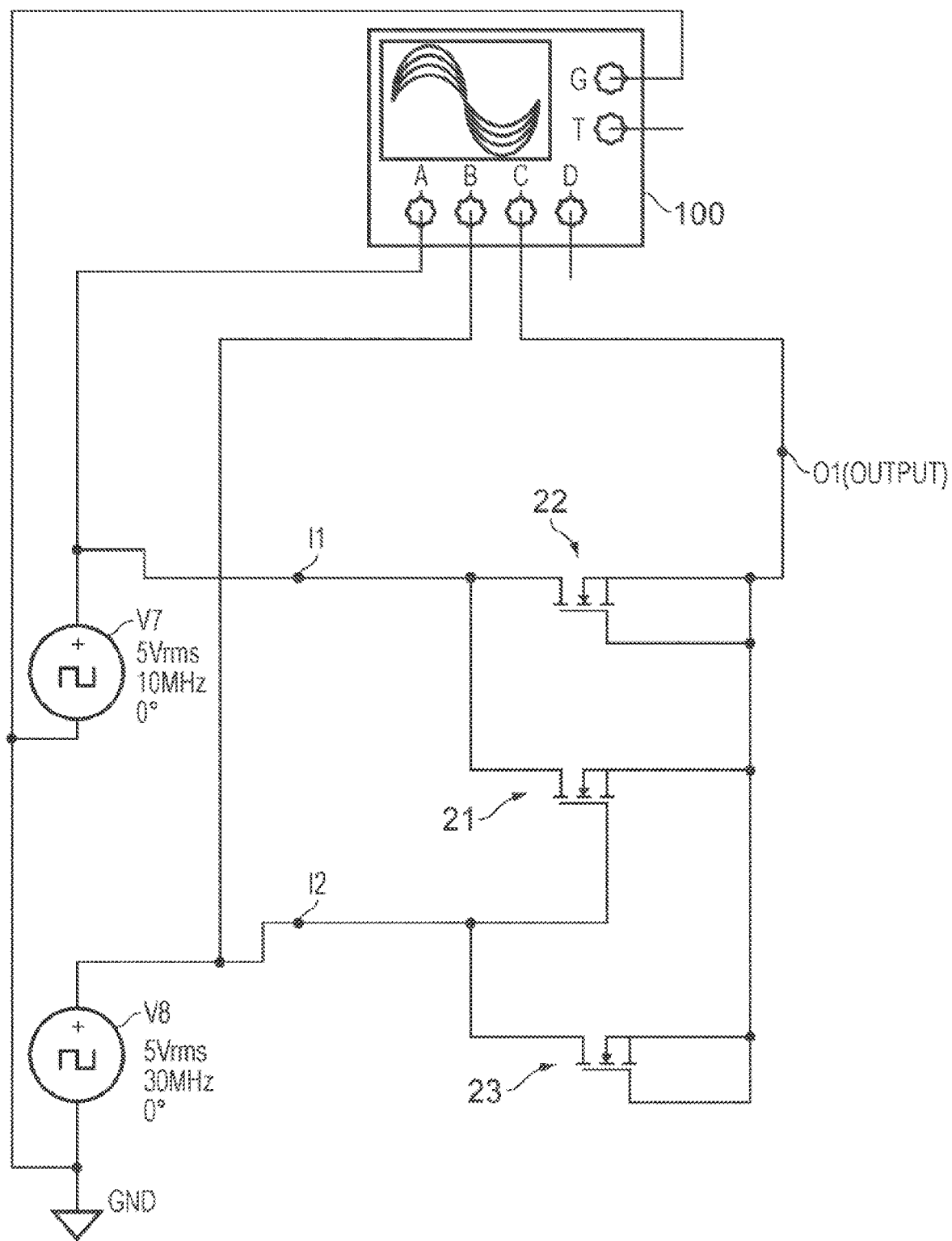
FIG. 7 illustrates another test circuit incorporating an AND gate in accordance with an aspect of the invention.
Figure 8:
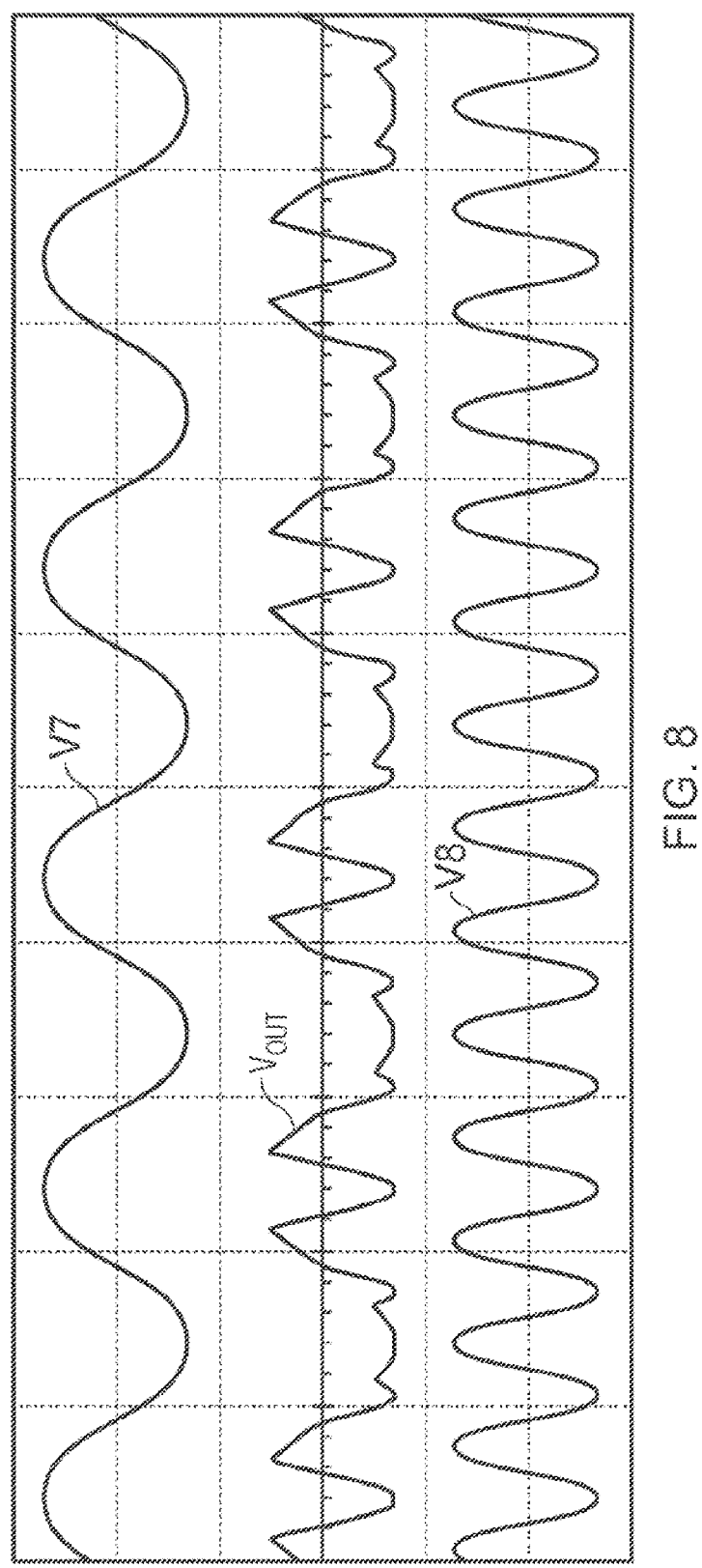
FIG. 8 illustrates voltage wave forms in the test circuit of FIG. 7.

FIG. 7 illustrates another simulation, based on the all-transistor fast AND gate from FIG. 5, this time with analog input voltages V7 and V8. This simulation illustrates why the AND gate 10 of FIG. 5 can be described as a fast analog AND gate. The two inputs are still at 10 MHz and 30 MHz, but instead of being 0 to 5 V square signals (digital), they are sinusoidal with a positive and a negative side. FIG. 8 illustrates the output signal Vout (at O1). As can be seen, Vout is a logical AND of the two analog input signals, V7 and V8. Thus, certain embodiments of the invention may be described as Fast Analog AND Gates, and also as Fast Digital AND Gates.

It will be appreciated that the AND gate 10 of FIG. 5 may also be described as a Fast Analog Powerless AND gate. Advantageously, it is not powered externally, it uses its own input signals to create the output signal, and it does not comprise or require a load. In operation, it drives a hard output high, as well as hard output low, meaning fast rising edge and fast falling edge. It may therefore be incorporated in electronic circuits/apparatus to provide a very fast front end AND gate that does not consume energy (beyond that dissipated in resistive conduction and parasitic mechanisms), as will be appreciated from the following description of further aspects and embodiments.

Figure 9:
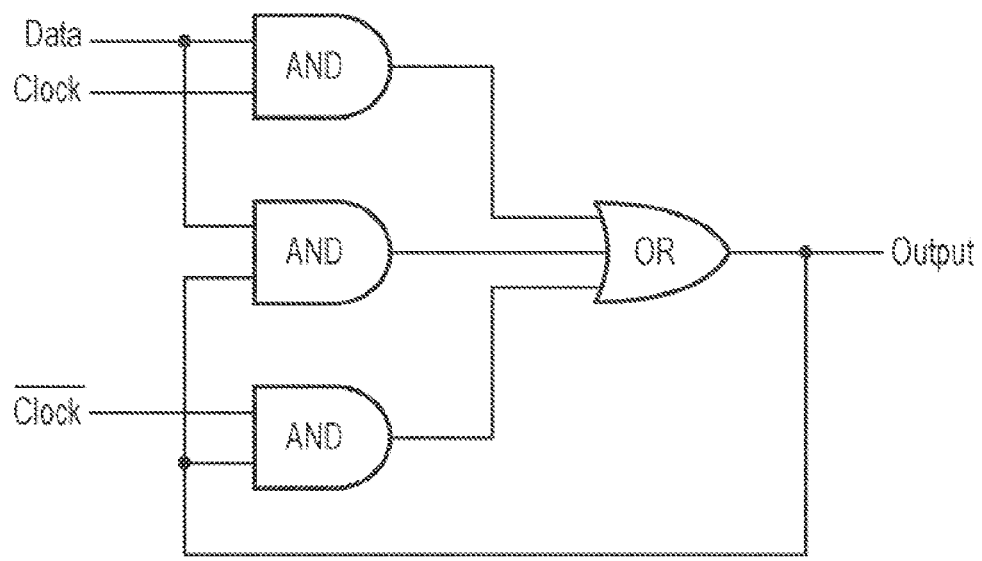
FIG. 9 illustrates a latch circuit in accordance with the prior art.

FIG. 9 shows a known latch circuit. Its benefits are that it is faster than cross-couple latches, and more stable as it always has two gate delays (and only two gate delays). A limitation, for applications of this latch circuit, is that it needs both "Clock" and "Inverted Clock" signals. A limitation with the latch of FIG. 9 is that one cannot create a Clock divider with it.

Figure 10:
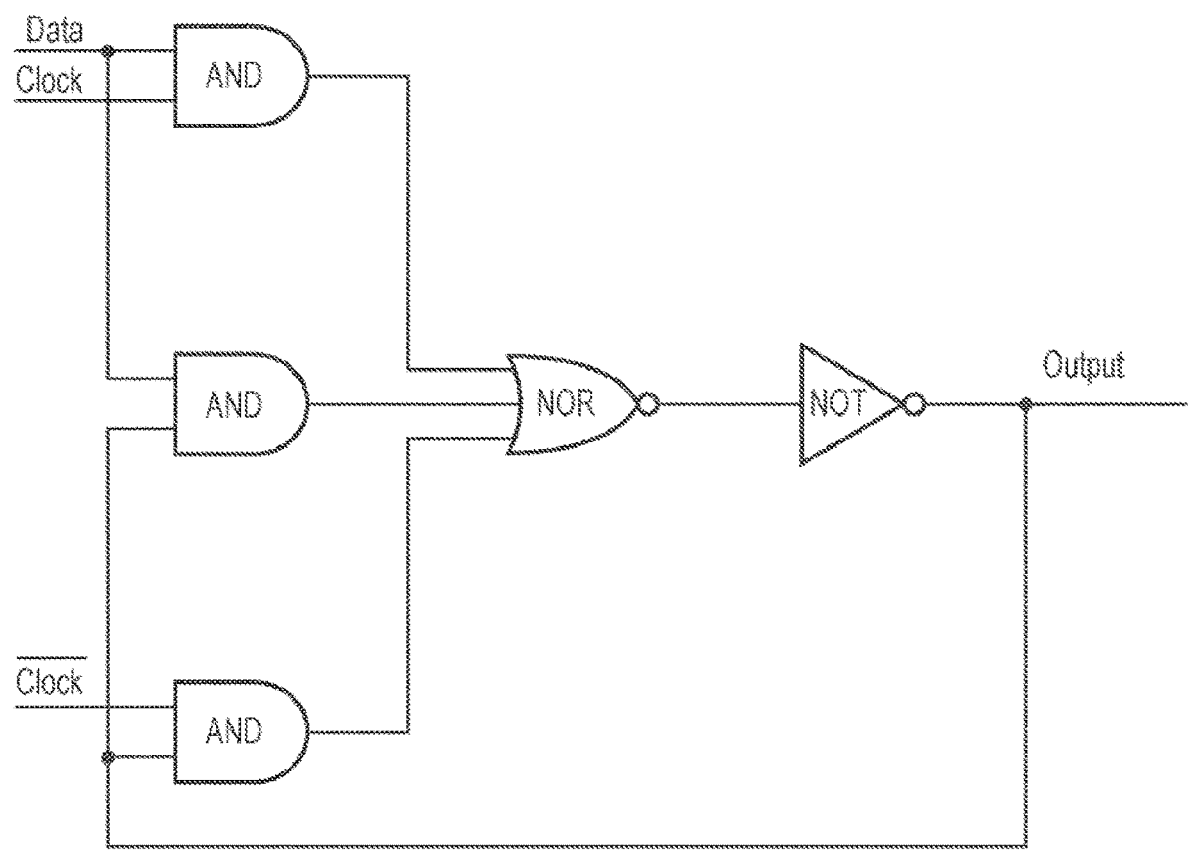
FIG. 10 illustrates a modified latch circuit, on which certain aspects and embodiments of the invention may be based.

With a Fast AND gate embodying one of the above-described aspects of the invention, the latch of FIG. 9 can be transformed to better suit certain applications, as shown in FIG. 10. The circuit of FIG. 10 may thus be implemented with three Fast AND Gates, as described above, as its front-end, with normal logic (normal/conventional NOR gate and NOT gate (i.e. inverter) as back-end).

Figure 11:
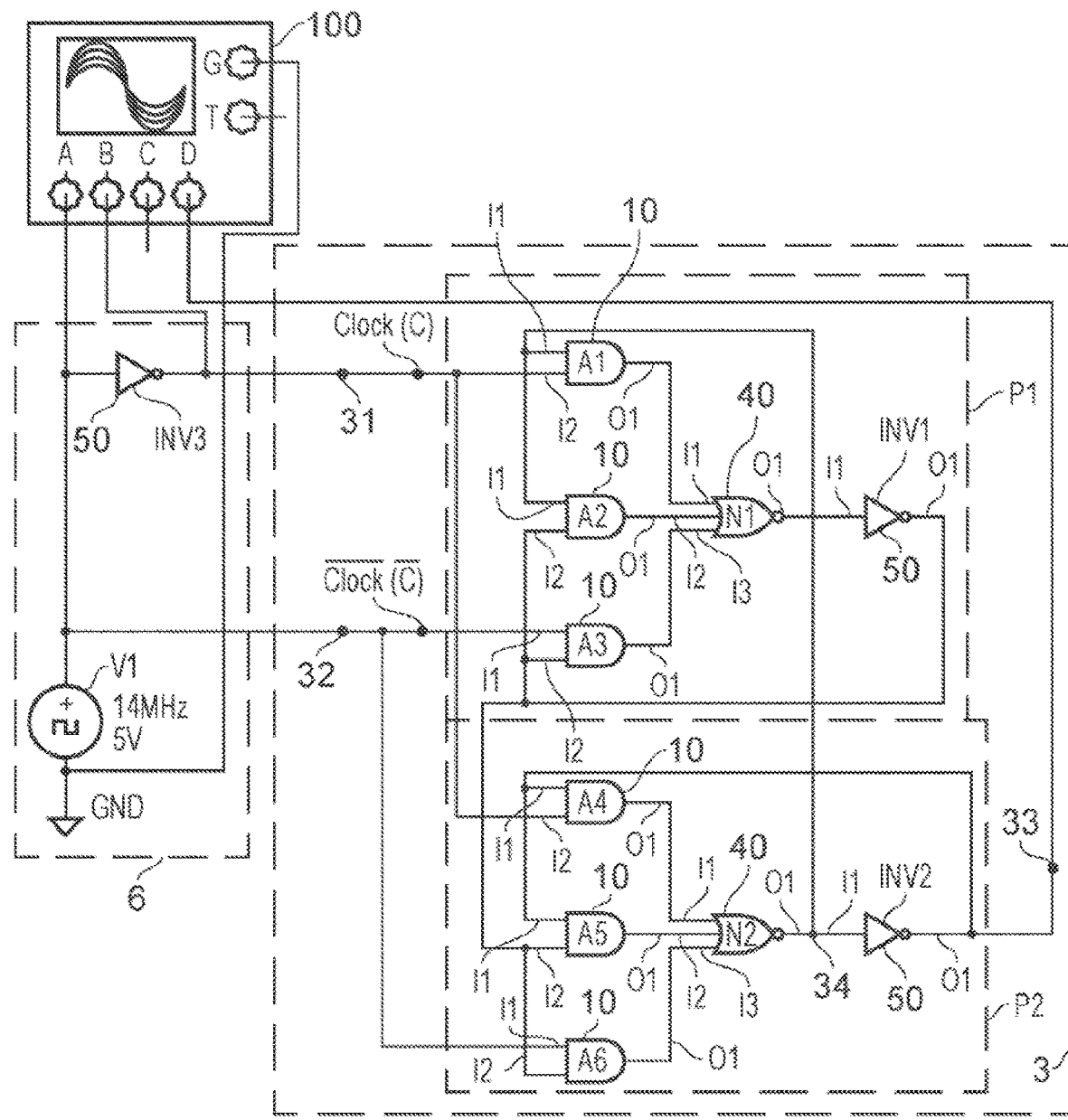
FIG. 11 illustrates apparatus embodying an aspect of the invention; incorporating a clock signal generator stage and a clock divider stage.

The structure shown in FIG. 10 still cannot divide the frequency of a Clock signal, so in certain embodiments it is enhanced/modified to create a "D latch" equivalent. FIG. 11 shows such an embodiment, comprising a clock generator (or clock extractor) stage 6, and a clock divider 3 (which may also be referred to as a clock divider stage).

FIG. 11 thus illustrates a clock divider stage 3 for receiving a first clock signal (C or CLOCK) oscillating at a first frequency and a second clock signal (Cbar or CLOCKbar), said second clock signal being an inversion of said first clock signal, and generating a first output clock signal (V33 at 33) oscillating at half of said first frequency. The clock divider stage 3 comprises: a first input terminal 31 for receiving said first clock signal; a second input terminal 32 for receiving said second clock signal; and a first output terminal 33 at which, in use, said first output clock signal is generated. The divider stage further comprises: a first circuit portion P1 comprising: first, second, and third AND gates 10 (A1, A2, A3 respectively), each having a respective first input I1, a respective second input I2, and a respective output O1; a first NOR gate 40 (N1) having three inputs (I1-I3), each connected to a respective one of the outputs of the first, second, and third AND gates, and an output (O1); and a first NOT gate 50 (or first inverter) (INV1) having an input I1, connected to the output of the first NOR gate, and an output O1; and a second circuit portion P2 comprising: fourth, fifth, and sixth AND gates 10 (A4, A5, A6 respectively), each having a respective first input, a respective second input, and a respective output; a second NOR gate 40 (N2) having three inputs, each connected to a respective one of the outputs of the fourth, fifth, and sixth AND gates, and an output; and a second NOT gate (or second inverter) 50 (INV2) having an input, connected to the output of the second NOR gate, and an output.

The first input of the first AND gate A1 is connected to the first input of the second AND gate A2 and to the output of the second NOR gate N2, and the second input of the first AND gate A1 is connected to the first input terminal 31.

The first input of the second AND gate A2 is connected to the first input of the first AND gate A1 and to the output of the second NOR gate N2, and the second input of the second AND gate A2 is connected to the second inputs of the third, fifth, and sixth AND gates (A3, A5, A6) and to the output of the first NOT gate INV1.

The first input of the third AND gate A3 is connected to the second input terminal 32, and the second input of the third AND gate A3 is connected to the second inputs of the second, fifth, and sixth AND gates (A2, A5, A6) and to the output of the first NOT gate INV1

The first input of the fourth AND gate A4 is connected to the first input of the fifth AND gate A5 and to the output of the second NOT gate INV2, and the second input of the fourth AND gate A4 is connected to the first input terminal 31.

The first input of the fifth AND gate A5 is connected to the first input of the fourth AND gate A4 and to the output of the second NOT gate INV2, and the second input of the fifth AND gate A5 is connected to the second inputs of the second, third, and sixth AND gates (A2, A3, A6) and to the output of the first NOT gate INV1.

The first input of the sixth AND gate A6 is connected to the second input terminal 32, and the second input of the sixth AND gate A6 is connected to the second inputs of the second, third, and fifth AND gates (A2, A3, A5) and to the output of the first NOT gate INV1.

Lastly, the first output terminal 33 is connected to the output of the second NOT gate INV2, and a second output terminal 34 is connected to the output of the second NOR gate N2.

Figure 12:
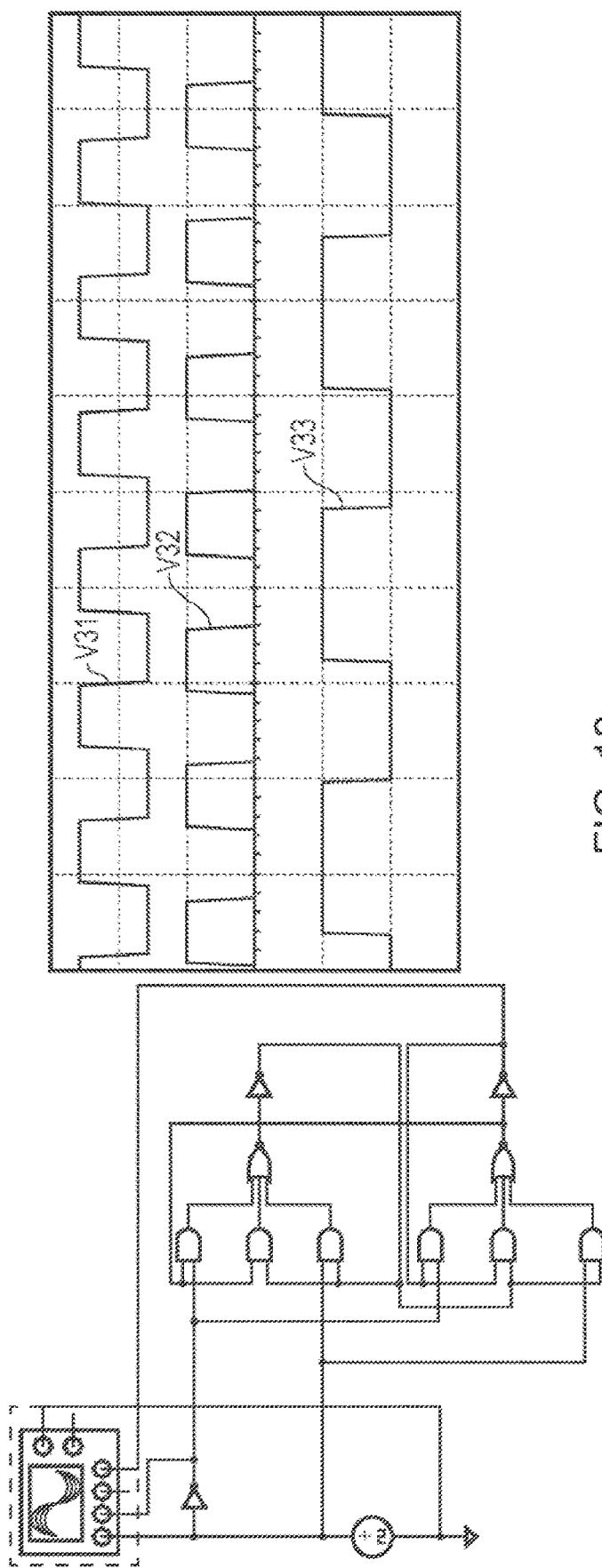
FIG. 12 illustrates voltage wave forms generated during operation of the circuit of FIG. 11.

The circuit further comprises a clock generator stage 6, comprising a third inverter 50 (INV3) and generating the clock and inverted clock signals from a square wave voltage V1. The circuit/apparatus of FIG. 11 works as a Clock divider, and the simulation results are shown in FIG. 12. The simulation was based on V1 being a square wave signal at 14 MHz/5V with standard logic gates initially, thus the delays in signals (V31 at 31 and V32 at 32 are not exactly 180 degrees out of phase with one another, and the output signal V33 at 33 shows a further delay. In certain embodiments such delays are acceptable. However, in further embodiments the AND gates A1 to A6 are replaced by the Fast Analog Powerless AND Gates described above, meaning that only four loads in total are needed to implement the circuit of FIG. 11 (one for each of the NOR and NOT gates).

In certain embodiments, each of the AND gates shown in FIG. 11 is an AND gate embodying one of the aspects of the invention described above. In certain such embodiments, the circuit is arranged to receive a high frequency oscillating signal, e.g. at 14 MHz. Advantageously, in such embodiments, only the front-end fast AND gates deal with the high frequency received signal (e.g. 14 MHz), and they do that easily without requiring power. Furthermore, the four loads/gates (N1, N2, INV1, INV2) after the Fast AND Gates A1-A6, are switching at half the input frequency (e.g. at 7 MHz, not at 14 MHz) with positive implications, e.g. lower power consumption.

Certain embodiments provide apparatus (e.g. a circuit) arranged to receive an oscillating signal (e.g. a wireless signal, received by an antenna, e.g. an NFC antenna) and generate a clock and an inverted clock from the received signal. It will be appreciated that, in the context of this specification, the inverted clock signal is a signal that is at least substantially an inverse of the clock signal, in the sense that the inverted clock signal is substantially low when the clock signal is substantially high, and substantially high when the clock signal is substantially low. In certain embodiments, the inverted clock may be a logical opposite of the clock signal. There may, in certain embodiments, be a phase difference of not exactly 180 degrees between the clock and inverted clock, but they are substantially in antiphase. Certain embodiments provide a clock generator (which may also be referred to as a clock extractor) able to create an inverted Clock (and clock) from an NFC signal. It would, of course, be counterproductive to use a logic inverter to do so, as it would need to operate at 13.56 MHz, with the associated power consumption implications.

Figure 13A:
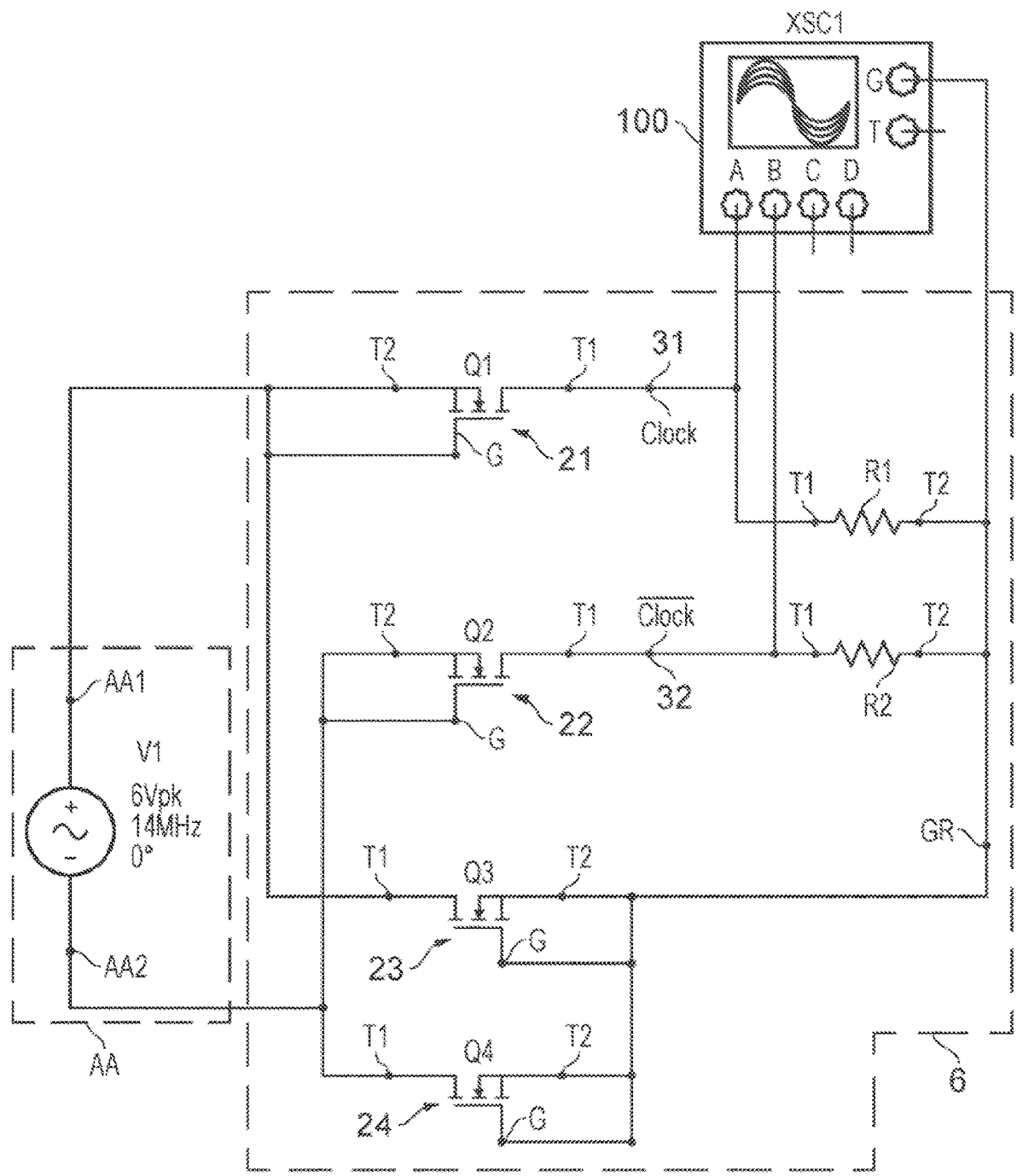
FIG. 13 (a) illustrates a clock signal generator circuit (or clock extractor) in accordance with another aspect of the invention, and suitable for incorporation in other aspects and embodiments of the invention.
Figure 13B:
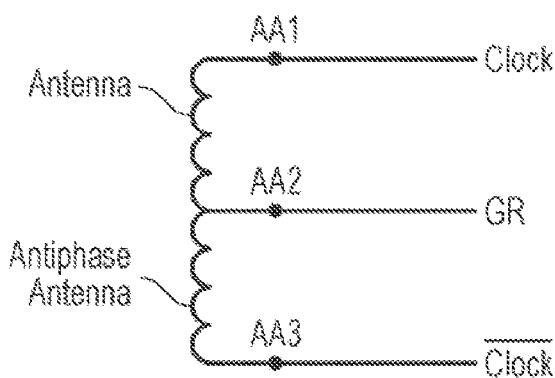
Figure 13C:
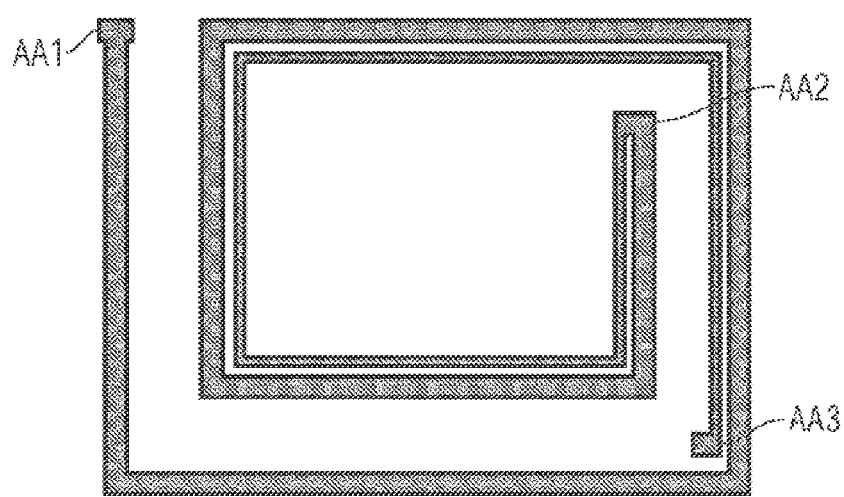

FIG. 13 (a) illustrates one such embodiment (a clock generator stage 6). The clock signal generator stage 6 comprises a plurality of field effect transistors, FETs, each having a respective first terminal T1, a respective second terminal T2, and a respective gate terminal G to which a voltage may be applied to control a conductivity of a respective channel between the respective first terminal and the respective second terminal. Although this embodiment comprises a plurality of FETs, it will be appreciated that each FET is in a diode-connected configuration, with its gate connected to one of its source and drain terminals. Thus, depending on the device technology being used (e.g. NMOS or PMOS), the skilled person will select the appropriately connected diode-connected transistors to provide the correct diode operation for proper functioning of the clock generator stage. Furthermore, in alternative embodiments, one or more (and, in certain embodiments, all) of the FETs in FIG. 13 may be replaced by respective diodes, including Schottky or other low forward drop diodes. Returning to the embodiment of FIG. 13, the plurality of FETs of the clock signal generator stage comprises: a first FET 21 having its first terminal directly connected (coupled) to the first input terminal 31 of the first clock divider stage, and its second and gate terminals directly connected (coupled) to the first antenna terminal AA1 of an antenna AA; a second FET 22 having its first terminal directly connected (coupled) to the second input terminal 32 of the first clock divider stage, and its second and gate terminals directly connected (coupled) to the second antenna terminal AA2 of the antenna AA; a third FET 23 having its first terminal directly connected (coupled) to the first antenna terminal AA1, and its second and gate terminals directly connected (coupled) to a first voltage rail GR; and a fourth FET 24 having its first terminal directly connected (coupled) to the second antenna terminal AA2, and its second and gate terminals directly connected (coupled) to the first voltage rail GR. The clock extractor 6 also comprises: a first resistor R1 having a first terminal T1 connected to the first input terminal 31 of the first clock divider stage, and a second terminal T2 connected to the first voltage rail GR; and a second resistor R2 having a first terminal T1 connected to the second input terminal 32 of the first clock divider stage, and a second terminal T2 connected to the first voltage rail GR. This first voltage rail may be a common voltage rail for other components of the system, e.g. a ground rail.

FIG. 13 (b) shows an alternative embodiment of a clock generator stage 6. The clock signal generator stage 6 comprises an antenna and an antiphase antenna, both of which are connected to the circuit. The RFID (e.g. NFC) signal is received across the antenna connected between terminals AA1 and AA2. The same signal is received in opposing phase, i.e. inverted, across the antiphase antenna connected between terminals AA2 and AA3. The clock signal may be taken directly from terminal AA1 and is connected to the first input terminal 31 of the first clock divider stage. The inverted clock signal may be taken directly from terminal AA3 and is connected to the second input terminal 32 of the first clock divider stage. A common voltage rail GR may be connected to terminal AA2. The voltage and current of the inverted clock signal may be selected, and may differ from those of the clock signal, by using conductors of different conductance, and/or by using different numbers of turns, in the antenna from those in the antiphase antenna. The antenna and antiphase antenna may be arranged in any of the known formats to generate signals of opposing phase. For example, if the antenna is formed as a spiral inductor, the antiphase antenna may simply 'run backwards' parallel to the antenna, as illustrated in FIG. 13 (c).

In contrast to the first embodiment of a clock generator stage 6, this alternative embodiment requires no transistors, diodes or other active devices, potentially simplifying the clock divider circuit and reducing power consumption. It may also generate a relatively clean, robust analogue inverted clock signal. However this alternative embodiment requires an additional antenna and an additional terminal to generate the inverted clock signal.

Figure 14:
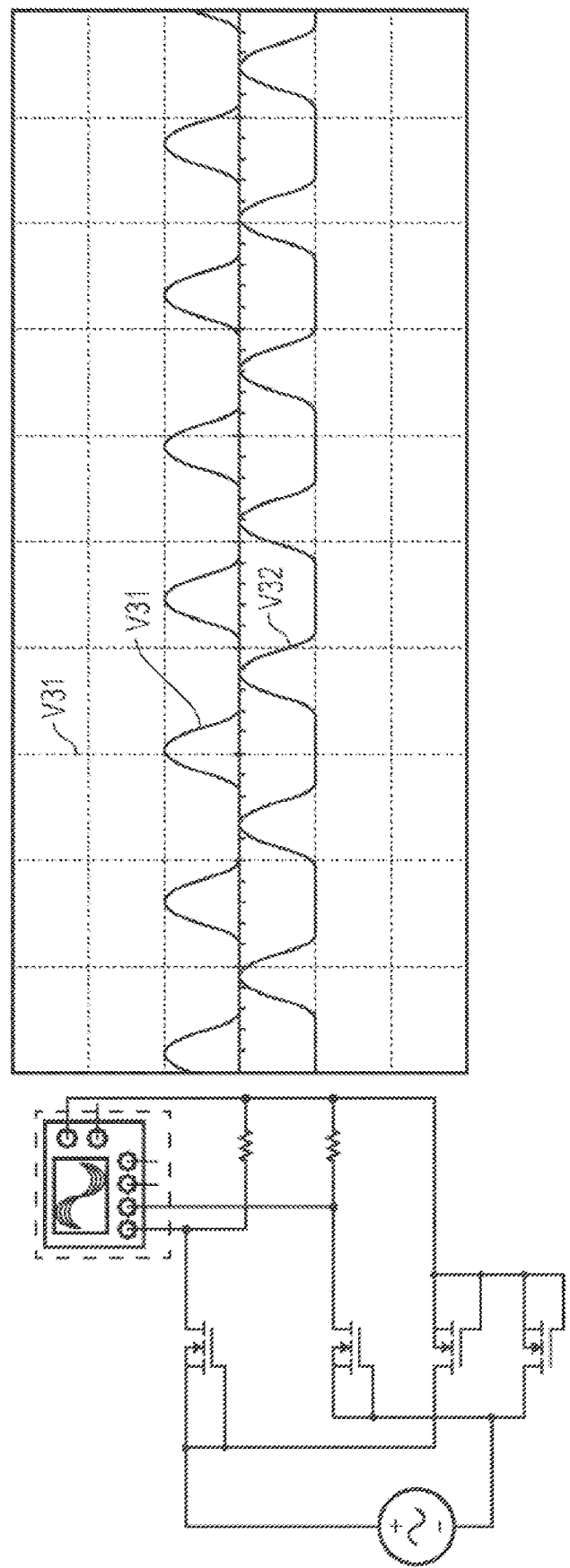
FIG. 14 illustrates voltage wave forms generated in the operation of the circuit of FIG. 13 (a)

FIG. 14 illustrates simulation results for the circuit of FIG. 13 (a), using a sinusoidal oscillating voltage at 14 MHz, 6V peak, generated across the antenna terminals AA1 and AA2. It is important to note that virtually no power is needed to generate both clocks (V31 and V32), since resistors R1 and R2 are typically high resistances that conduct very little current.

Further embodiments provide a cascading Low Power Clock Divider, incorporating a Low Power Clock and Inverted Clock generator 6, and a Fast/Low Power clock divider 3 as described above. Certain embodiments incorporate a cascade of seven clock divider stages as described above, for example for NFC applications in which one may need to divide the Clock seven times, from 13.56 MHz to 106 KHz.

Figure 15:
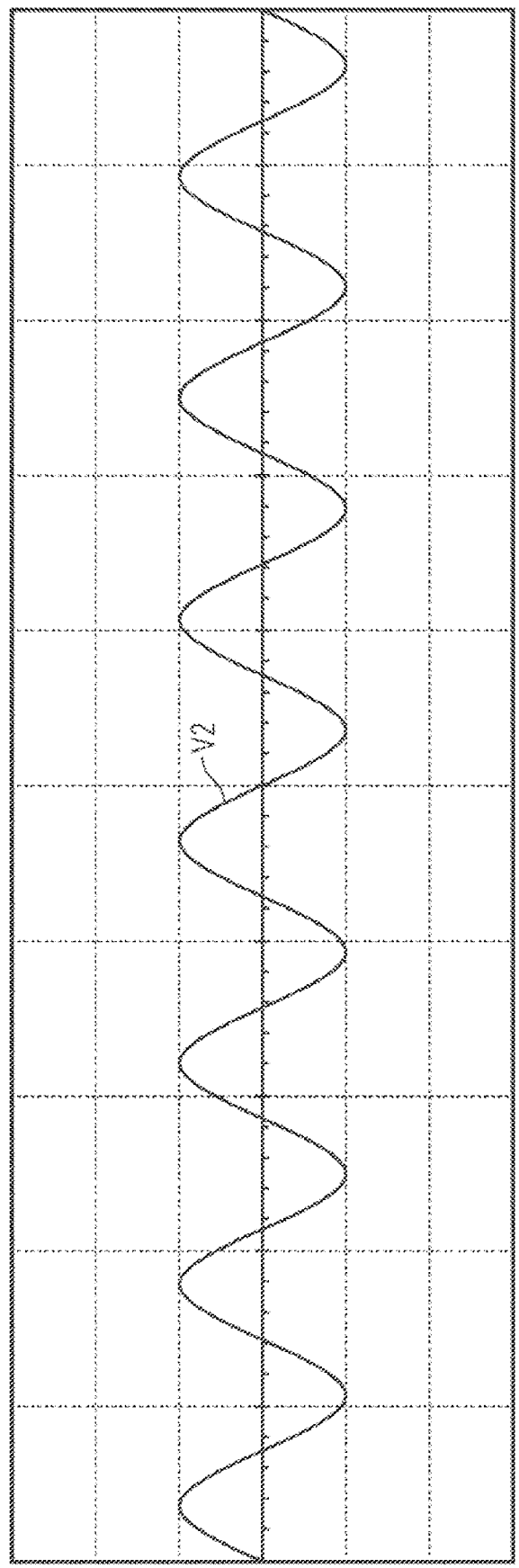
FIG. 15 illustrates a voltage wave form generated at the antenna terminals of an antenna used in certain embodiments of the invention.

FIG. 15 illustrates a representative "NFC" input signal "V2" being at 14 MHz and +/−5V used in certain simulations of embodiments of the invention (5V here because the logic used in those simulations is 5V as well).

Figure 16:
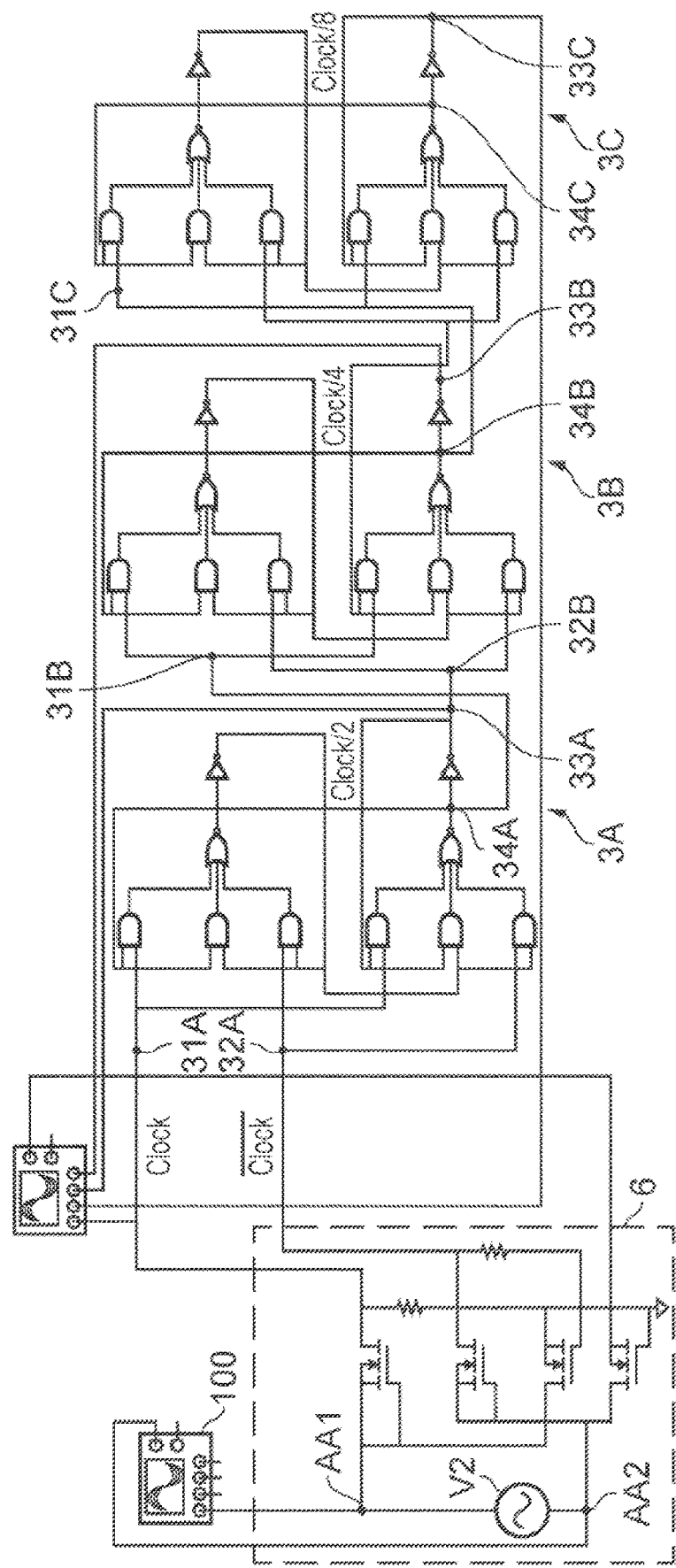
FIG. 16 illustrates a cascading low power clock divider circuit embodying an aspect of the present invention.
Figure 17:
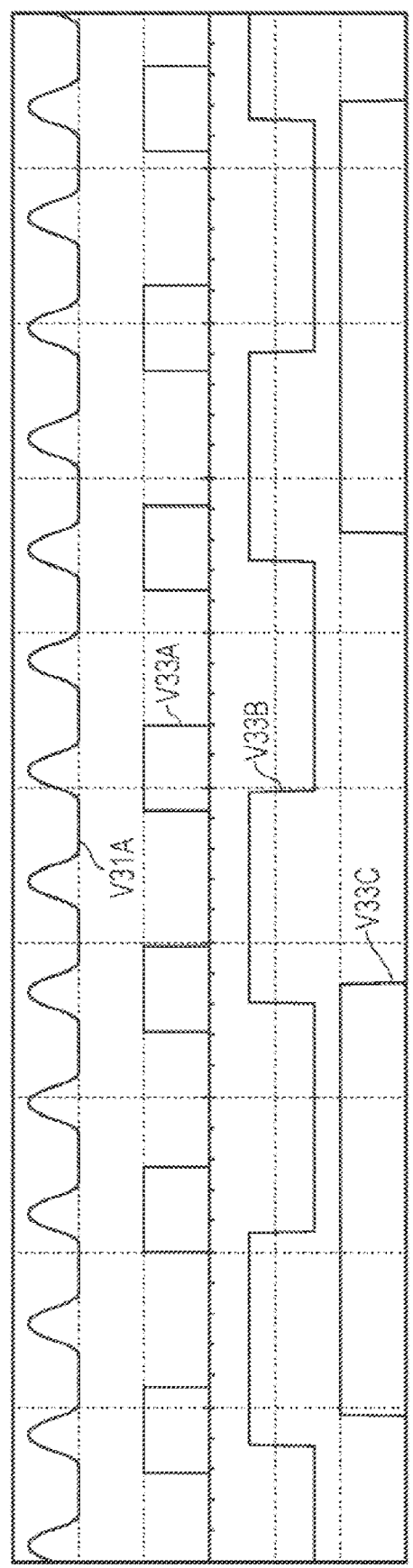
FIG. 17 illustrates voltage wave forms for the circuit of FIG. 16.

FIG. 16 illustrates a simulation of apparatus embodying an aspect of the invention, comprising a clock extractor stage 6, arranged to receive an NFC signal at an antenna and generate voltage V2 across (i.e. between) antenna terminals AA1 and AA2, and a subsequent cascade of three clock divider stages 3A, 3B, 3C, each utilising conventional AND gates. The first clock divider stage 3A is arranged to receive said first and second clock signals at its input terminals 31A and 32A. Each subsequent clock divider stage is arranged to receive, at its first and second input terminals respectively, the first and second output clock signals from the preceding clock divider stage. The simulation results for FIG. 16 are shown in FIG. 17. The delays in the signals are due to the different gates latencies, including those of the conventional AND gates. V31A is the first stage's clock input, V33A is the first divider stage output, V33B is the second divider stage output, and V33C is the third and final divider stage's output. As mentioned above, in certain alternative embodiments, there may be a different number of cascaded/series connected divider stages (e.g. 2, 4, 5, 6, 7, etc. or more). As noted above, in this embodiment no divider stages utilise fast AND gates, and such embodiments are well suited to circuits for which high frequency operation and low power consumption are not critical design requirements. In further embodiments, all or only a sub-set of divider stages may utilise fast AND gates, for example those for which high frequency operation is required.

Figure 18:
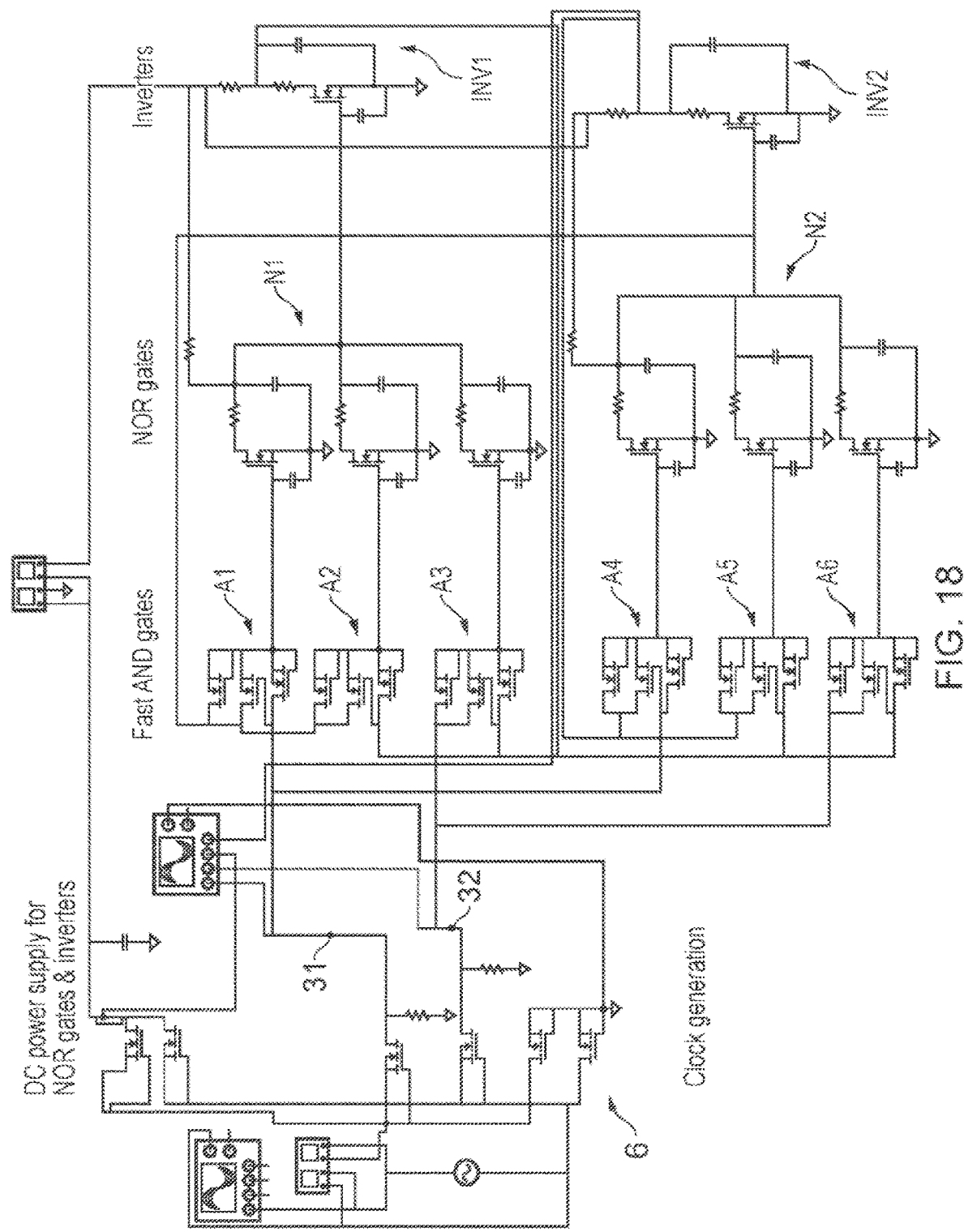
FIG. 18 illustrates electronic apparatus in accordance with another embodiment of an aspect of the present invention, incorporating a clock generator and clock divider.
Figure 19:
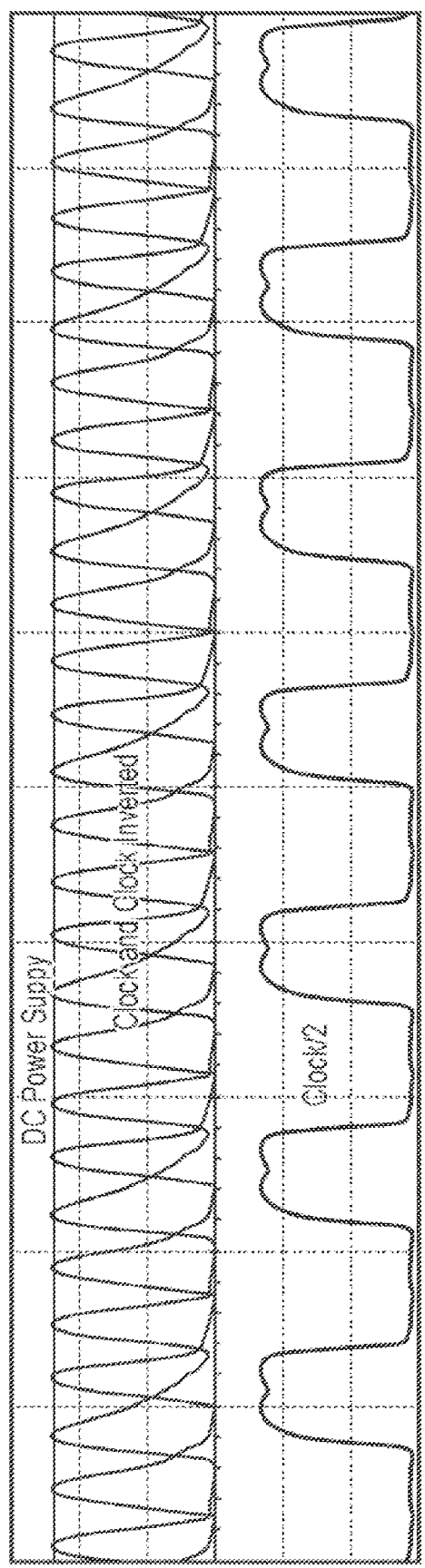
FIG. 19 illustrates voltage wave forms in the circuit of FIG. 18.

Referring now to FIG. 18, this shows another embodiment of the invention, namely a transistor implementation of 1×Clock divider with Clock generation circuit 6, power supply for the NOR and NOT gates, Fast AND gates A1-A6, two NOR gates N1 and N2, and two Inverters/NOT gates INV1 and INV2. The transistors are NMOS transistors used with Level 1 Spice models. The resistors/capacitors around the NOR and Inverters are there to add parasitic elements. Tuning of the right device size and ratio may be needed for any application circuit design for a particular unipolar device technology. When increasing the Load resistor value, the TFT ratio has to be tuned accordingly. The simulation results are shown in FIG. 19, with power budget at +/−6V and 14 MHz input signal. The Clock divider exhibits a simulated power consumption of 175 uW and the front end clock and inverted clock generator exhibits a simulated power consumption of 75 uW, giving a total (for a clock signals generator and 1 divider stage) of around 250 uW. Power consumption may be further optimized by tuning transistor ratios, but based on this simulation, a full system with front end and 7 stages of dividers would consume around 500 uW at 6V.

Throughout the description and claims of this specification, the words "comprise" and "contain" and variations of them mean "including but not limited to", and they are not intended to (and do not) exclude other moieties, additives, components, integers or steps. Throughout the description and claims of this specification, the singular encompasses the plural unless the context otherwise requires. In particular, where the indefinite article is used, the specification is to be understood as contemplating plurality as well as singularity, unless the context requires otherwise.

Features, integers, characteristics, compounds, chemical moieties or groups described in conjunction with a particular aspect, embodiment or example of the invention are to be understood to be applicable to any other aspect, embodiment or example described herein unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The invention is not restricted to the details of any foregoing embodiments.

The invention extends to any novel one, or any novel combination, of the features disclosed in this specification (including any accompanying claims, abstract and drawings), or to any novel one, or any novel combination, of the steps of any method or process so disclosed.

The reader's attention is directed to all papers and documents which are filed concurrently with or previous to this specification in connection with this application and which are open to public inspection with this specification, and the contents of all such papers and documents are incorporated herein by reference.

The invention claimed is:

1. An AND gate comprising:
a first input;
a second input;
an output; and
a plurality of field effect transistors, FETs, each having a respective first terminal, a respective second terminal, and a respective gate terminal to which a voltage may be applied to control a conductivity of a respective channel between the respective first terminal and the respective second terminal,
wherein said plurality of FETs comprises:
a first FET having its first terminal directly connected to the first input, its second terminal directly connected to the output, and its gate terminal directly connected to the second input;
a second FET having its first terminal directly connected to the first input, its second terminal directly connected to the output, and its gate terminal directly connected to the output; and
a third FET having its first terminal directly connected to the second input, its second terminal directly connected to the output, and its gate terminal directly connected to the output.

2. An AND gate in accordance with claim 1, wherein each of said plurality of FETs is an N-channel device.

3. An AND gate in accordance with claim 1, wherein each of said plurality of FETs is a P-channel device.

4. An AND gate in accordance with claim 1, wherein each said first terminal is a drain terminal and each said second terminal is a source terminal.

5. An NFC tag comprising an AND gate in accordance with claim 1.

6. An AND gate comprising:
a first input;
a second input;
an output;
a field effect transistor, FET, having a first terminal, a second terminal, and a gate terminal to which a voltage may be applied to control a conductivity of a channel between the first terminal and the second terminal; and
first and second diodes, each having a respective first terminal and a respective second terminal, and having a forward conduction direction from the respective second terminal to the respective first terminal,
wherein said FET has its first terminal directly connected to the first input, its second terminal directly connected to the output, and its gate terminal directly connected to the second input,
said first diode having its first terminal directly connected to the first input, and its second terminal directly connected to the output, and
said second diode having its first terminal directly connected to the second input, and its second terminal directly connected to the output.

7. An AND gate in accordance with claim 6, wherein said FET is an N-channel device.

8. An AND gate in accordance with claim 6, wherein said FET is a P-channel device.

9. An AND gate in accordance with claim 6, wherein said first terminal of the FET is a drain terminal and said second terminal of the FET is a source terminal.

10. An AND gate in accordance with claim 6, wherein at least one of said first and second diodes comprises a respective diode-connected transistor.

11. An NFC tag comprising an AND gate in accordance with claim 6.

* * * * *